(12) United States Patent
Brecht et al.

(10) Patent No.: US 11,340,260 B2
(45) Date of Patent: May 24, 2022

(54) PROBE CARD PAD GEOMETRY IN AUTOMATED TEST EQUIPMENT

(71) Applicant: Teradyne, Inc., North Reading, MA (US)

(72) Inventors: Brian Brecht, Newbury Park, CA (US); Steve Ledford, Melrose, MA (US)

(73) Assignee: Teradyne, Inc., North Reading, MA (US)

( * ) Notice: Subject to any disclaimer, the term of this patent is extended or adjusted under 35 U.S.C. 154(b) by 156 days.

(21) Appl. No.: 16/726,640

(22) Filed: Dec. 24, 2019

(65) Prior Publication Data

US 2021/0190826 A1 Jun. 24, 2021

(51) Int. Cl.
*G01R 1/04* (2006.01)
*G01R 1/067* (2006.01)
*G01R 1/073* (2006.01)
*G01R 31/28* (2006.01)

(52) U.S. Cl.
CPC ..... *G01R 1/07342* (2013.01); *G01R 31/2834* (2013.01)

(58) Field of Classification Search
CPC ...... G01R 1/04; G01R 1/067; G01R 1/06733; G01R 1/073; G01R 1/07341; G01R 1/07342; G01R 31/28; G01R 31/2863; G01R 31/2889
See application file for complete search history.

(56) References Cited

U.S. PATENT DOCUMENTS

| | | | |
|---|---|---|---|
| 5,210,485 A | 5/1993 | Kreiger et al. | |
| 7,332,921 B2 | 2/2008 | Nulty et al. | |
| 2002/0179904 A1* | 12/2002 | Zhou | H01R 11/18 257/48 |
| 2006/0250150 A1 | 11/2006 | Tunaboylu et al. | |

(Continued)

FOREIGN PATENT DOCUMENTS

| CN | 104508499 A | 4/2015 |
|---|---|---|
| CN | 104582236 A | 4/2015 |

(Continued)

OTHER PUBLICATIONS

PCT/US2020/064147, Apr. 8, 2021, International Search Report and Written Opinion.

(Continued)

*Primary Examiner* — Neel D Shah
(74) *Attorney, Agent, or Firm* — Wolf, Greenfield & Sacks, P.C.

(57) ABSTRACT

A probe card in an automated test equipment (ATE) and methods for operating the same for testing electronic devices. The probe card may be a portion of a vertical-type probe card assembly in which pads on a circuit board are contacted by probe pins. The probe card has a pad geometry that compensates for misalignment with corresponding probe pins due to manufacturing error or a mismatch of coefficient of thermal expansion, enabling reliable operation of the ATE over a wide range of test temperatures. The pad array may have a plurality of elongated pads, each of uniquely designed size, tilt angle, and/or center location, with the characteristics of each pad being dependent on a distance between each pad and a centroid of the pad array, such that a probe pin to pad location errors can be mitigated.

9 Claims, 8 Drawing Sheets

(56) References Cited

U.S. PATENT DOCUMENTS

| | | |
|---|---|---|
| 2007/0145989 A1 | 6/2007 | Zhu et al. |
| 2009/0091343 A1 | 4/2009 | Wu et al. |
| 2009/0176406 A1 | 7/2009 | Yaghmai et al. |
| 2010/0164521 A1 | 7/2010 | Chen et al. |
| 2010/0255690 A1 | 10/2010 | Waite et al. |
| 2013/0027071 A1 | 1/2013 | Canegallo et al. |
| 2013/0033283 A1 | 2/2013 | Wu et al. |
| 2018/0024167 A1 | 1/2018 | Maggioni |

FOREIGN PATENT DOCUMENTS

| | | |
|---|---|---|
| CN | 205787004 U | 12/2016 |
| CN | 107367678 A | 11/2017 |
| JP | H11-30632 A | 2/1999 |
| JP | 2011-222928 A | 11/2011 |
| JP | 2012-015469 A | 1/2012 |
| JP | 2012-132685 A | 7/2012 |
| JP | 2012-132823 A | 7/2012 |
| JP | 2019-071420 A | 5/2019 |
| KR | 10-2012-0076265 A | 7/2012 |

OTHER PUBLICATIONS

PCT/US2020/064148, Apr. 8, 2021, International Search Report and Written Opinion.
PCT/US2020/064167, Apr. 8, 2021, International Search Report and Written Opinion.
PCT/US2020/064170, Apr. 8, 2021, International Search Report and Written Opinion.
Brecht, Probe Card Assembly in Automated Test Equipment, U.S. Appl. No. 16/726,649, filed Dec. 24, 2019.
Brecht, Transposed Via Arrangement in Probe Card for Automated Test Equipment, U.S. Appl. No. 16/726,657, filed Dec. 24, 2019.
Brecht, Coaxial Via Arrangement in Probe Card for Automated Test Equipment, U.S. Appl. No. 16/726,665, filed Dec. 24, 2019.
Lee, Shape Optimization of Vertical-type Probe Needle Integrated with Floating Mount Technology. Thesis presented to University of Waterloo, Ontario, Canada. 2013. 60 pages.
International Search Report and Written Opinion dated Apr. 8, 2021 in connection with International Application No. PCT/US2020/064147.
International Search Report and Written Opinion dated Apr. 8, 2021 in connection with International Application No. PCT/US2020/064148.
International Search Report and Written Opinion dated Apr. 8, 2021 in connection with International Application No. PCT/US2020/064167.
International Search Report and Written Opinion dated Apr. 8, 2021 in connection with International Application No. PCT/US2020/064170.
U.S. Appl. No. 16/726,649, filed Dec. 24, 2019, Brecht.
U.S. Appl. No. 16/726,657, filed Dec. 24, 2019, Brecht.
U.S. Appl. No. 16/726,665, filed Dec. 24, 2019, Brecht.

\* cited by examiner

PROBE CARD PAD GEOMETRY IN AUTOMATED TEST EQUIPMENT

BACKGROUND

Electronic components, such as semiconductor devices, circuits, and printed circuit board (PCB) assemblies, are frequently tested, during and after their manufacture, using a test system such as an automated test equipment (ATE). To perform these tests, an ATE may include instruments that generate or measure test signals such that a range of operating conditions can be tested on a particular device-under-test (DUT). An instrument, for example, may generate a pattern of digital or analog signals that are applied to a semiconductor device, and may measure digital or analog signals from the semiconductor device as a response.

In some instances, semiconductor devices are tested at the wafer level. Testing at the wafer-level has several benefits including testing and validating a device as a known good die before it is diced as a semiconductor die and packaged. A wafer may contain many devices, and permit testing of a large number of devices in close proximity to each other without having to reload another wafer, which can decrease testing time and increase manufacturing throughput.

Each device under test contains exposed connection structures such as pads or bumps, which may serve as test points at which test signals may be applied to or measured to a DUT on a wafer. An ATE interfaces with the device using a probe card assembly that contains an array of multiple probe pins. Each probe pin has a tiny probe needle on a free end that is used to make electrical contact to a test point of the DUT, with the opposite end of the probe pin electrically connected to pads on a printed circuit board, which may be part of the tester or may be part of the probe card assembly that, in turn, is electrically connected to the tester. Sometimes a probe card assembly includes more than one circuit boards stacked vertically over each other to form a probe card. Mechanical supports within the probe card assembly hold the probe pins and press the pins against the printed circuit board in the probe card, enabling contact to be made between the board and the pins. In order to make electrical contact to the wafer, a wafer prober presses the wafer against the probe needles so that the needle tips make physical and electrical contact with test points on the device. Once the probe needles have made contact with both the test points on the wafer and the pads that are electrically coupled to the tester, the testing process can begin.

SUMMARY

Disclosed herein are probe card pad geometry in an automated test equipment (ATE) and methods for operating the same for testing electronic devices. The inventors have recognized and appreciated in a vertical-type probe card, pads on a circuit board facing the probe pins may be misaligned with corresponding probe pins due to manufacturing error or a mismatch of coefficient of thermal expansion. Aspects of the present application provide a pad array with a plurality of elongated pads each of uniquely designed size, tilt angle, and/or center location that are dependent on a distance between the pad and a centroid of the pad array, such that probe pin to pad location errors can be mitigated.

According to some embodiments, an automated test equipment (ATE) for testing a device under test (DUT) is provided. The ATE comprises a plurality of probe pins configured to contact the DUT; a probe card and a plurality of pads disposed on a surface of the probe card and configured to be in contact with the plurality of probe pins. The plurality of pads comprises a first column of elongated pads arranged along a first direction. Each elongated pad has a long axis with a tilt angle relative to the first direction. A first tilt angle of a first elongated pad in the first column is different from a second tilt angle of a second elongated pad in the first column.

According to some embodiments, a method for testing a device under test (DUT) with an automated test equipment (ATE) is provided. The method comprises contacting the DUT with a plurality of probe pins and contacting the plurality of probe pins with a probe card at a plurality of contact points. The probe card comprises an array of pads disposed on a surface of a probe card with contact points of the plurality of contact points being on respective pads of the array. The array of pads comprises a centroid. The method further comprises changing the test temperature of the DUT such that the location of the plurality of contact points with respect to the centroid of the array follows a respective path. Pads of the plurality of pads in an outer portion of the array are shaped differently from pads at a center portion of the array, and such that the contact points on a respective path maintain a minimum spacing from edges of the pad.

According to some embodiments, a circuit board is provided. The circuit board comprises a plurality of elongated pads disposed on a surface and arranged according to a plurality of spatial parameters in a non-uniform array. Each elongated pad has a distance from a center of the non-uniform array. Each of the plurality of spatial parameters has a non-zero offset relative to corresponding spatial parameters in a uniform array having a periodic column extending along a first direction, and the non-zero offsets of the plurality of spatial parameters in the non-uniform array vary based on distances from the center.

The foregoing is a non-limiting summary of the invention, which is defined by the appended claims.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
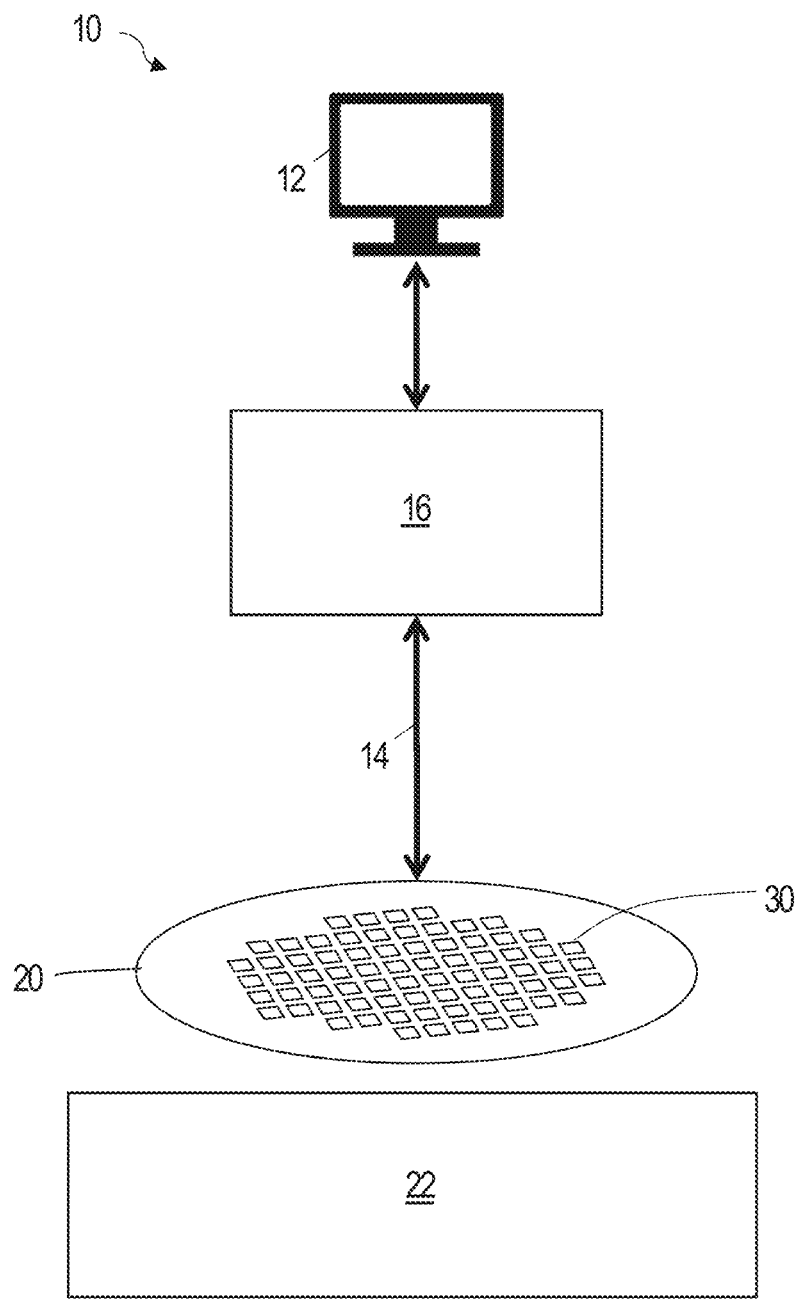
FIG. 1 is a high-level schematic diagram of an exemplary test system according to aspects of the present application.

In certain probe card assemblies, such as vertical-type probe card assemblies, an array of probe pins are each arranged perpendicularly, or "vertically" from a wafer surface, with free ends of the probe pins used to contact a corresponding array of test points on a DUT on the wafer to test the DUT. The DUT may be a semiconductor device or semiconductor package having an array of exposed pads or solder bumps serving as test points. Probe pins in such a vertical-type probe card assembly are mechanically held within one or more guide plates and arranged with the same pitch as test points on the DUT such that a probe needle at the free end of each probe pin will land on a corresponding test point during testing. The opposite ends of the probe pins are each in contact with a corresponding pad on a surface of a circuit board in a probe card within the probe card assembly. The pads serve to electrically interface test points on the DUT with circuitry in the rest of the tester via the probe pins.

While the array of pads on the circuit board, the array of probe pins and the array of test points on the DUT have generally a one-to-one correspondence and may be designed to be aligned with each other, the inventors have appreciated and recognized scenarios that may cause misalignment between the pads on the circuit board and the probe pins, to the extent that some probe pins may miss the pads when the probe pins are brought into contact with the circuit board. Aspects of the present application are directed to a probe card pad array design that addresses the risk of probe pin to pad misalignment.

In a first scenario, for example, finite errors from manufacturing tolerance may cause pads on the probe card to deviate from their intended locations. Errors may result from stretching or compression of a surface of the circuit board during manufacturing, such that a pad location on the surface shifts from its designed location by a pad location error. Stretching or compression is typically biaxial along the surface of the circuit board, and the pad location error increases proportionally with the distance from a center of the pad array that corresponds to a center of the test point array on the DUT to be probed. Therefore while pads near the center of the pad array may be aligned to and contacted successfully by corresponding probe pins, pads that are farther away from the center may have an increasingly larger pad location error. As semiconductor dies are becoming highly integrated with a high density of components on their surfaces, the number of test points on a single semiconductor die can reach hundreds or even the thousands, with ever decreasing spacing between the test points. Correspondingly, pad size and spacing on the probe card has become smaller and smaller to accommodate testing of highly integrated semiconductor dies. When the error between a pad and a probe pin is on order of the pad size, the corresponding probe pin is likely to fail to align with the pad and would either fail to contact a pad or would contact the wrong pads. Probe cards designed for testing high density DUTs having fine pitch between test points are particularly susceptible to such a misalignment failure due to manufacturing, as the pads are designed to have correspondingly small pitch and small pad sizes.

In a second scenario, for example, when operating the tester to test a DUT, temperature changes of the DUT may cause pad locations in the probe card to shift along the surface of the circuit board in the probe card. Depending on the operational state of the DUT and temperatures of the test environment, temperature of the probe card components can vary from colder than ambient, for example less than −40° C., to higher than 55° C. As temperature increases, a component expands by an amount proportional to the product of the component's coefficient of thermal expansion (CTE) and the amount of temperature change. In the probe card, there is typically a mismatch between CTE of the circuit board and CTE of the guide plate supporting the probe pins. As a result, pads on the surface of the circuit board will shift location relative to the corresponding probe pins due to the thermal expansion mismatch. In particular, the inventors have appreciated and recognized that the relative pad location shift due to CTE mismatch increases proportionally with the distance from a center of the pad array.

Aspects of the present application are directed to a novel pad array design with a plurality of elongated pads that each has a uniquely designed spatial parameter such as pad center location, elongation tilt angle, widths, or combinations thereof. Because the arrangement of spatial parameters vary between pads, the pad array design as described herein may be referred to as a non-uniform array. In some embodiments, the non-uniform pad array design achieves improved testing reliability by reducing probe pin to pad misalignment issues arising from manufacturing error and/or CTE mismatch, as compared to conventional pad arrays having pads of the same shape, size, orientation, and spacing (referred to as a uniform array).

In some embodiments, each pad has an elongated shape and is tilted with a long axis that extends towards a center of the pad array. The inventors have appreciated and recognized that temperature change induced relative movement between a probe pin and the corresponding pad is generally along the direction radiating from the center of the pad array. As a result, an elongated pad shape tilted in accordance to the relative direction of each pad from the center of the pad array may provide a larger conductive landing surface on the pad along the path of movement of the probe pin during thermal expansion or thermal contraction for making electrical contact with the probe pin compared to pads that are not elongated.

In some embodiments, a width of the elongated pad is varied based on a distance of the pad from the center of the array, for example in proportion with the distance such that a larger pad is provided for pads that are located far away from the center, to account for the relatively larger pad location shifts due to the CTE mismatch and temperature change, as well as due to manufacturing error.

In addition, in some embodiments center locations of the pads are also varied. Alternatively or in addition, pad-to-pad spacings are varied. For example, if a probe pin has a relative pad location that shifts between a cold location and a hot location, the pad may be centered at a location in between the cold and hot locations. The cold and hot locations may be determined prior to manufacturing of the probe card, based on intended usage of the ATE, and CTE of the components within the probe card.

The aspects and embodiments describes above, as well as additional aspects and embodiments, are described further below. These aspects and/or embodiments may be used individually, all together, or in any combination of two or more, as the application is not limited in this respect.

FIG. 1 is a high-level schematic diagram of an exemplary test system according to aspects of the present application. FIG. 1 illustrates a test system 10 that contains a test computer 12 that controls a tester 16 to perform tests on a device under test (DUT) 30 in accordance to methods disclosed in the present application. In some scenarios, the tester 16 may be an automated test equipment (ATE), constructed using techniques that are known in the art. The DUT 30 may be any suitable device for testing. For example, DUT 30 may be a semiconductor die disposed on a surface of a wafer 20. In some embodiments, DUT 30 may be an un-diced semiconductor die, along with a plurality of similar dies that are also on the wafer 20 for testing with ATE 16. ATE 16 may contain circuitry to generate and/or measure a test signal 14 for DUT 30. ATE 16 may include multiple instruments configured to generate or measure different types of analog or digital signals. Wafer 20 may be held by and moved into contact with ATE 16 via a wafer prober 22. Wafer prober 22 may also provide other functions, such as establishing temperature conditions for testing devices on a wafer.

It should be appreciated that FIG. 1 is a greatly simplified representation of an automated test system. For example, though not illustrated, test system 10 may include control circuitry that controls operation of instruments within ATE 16. Additionally, test system 10 may include processing circuitry to process measurements and determine whether a DUT 30 is operating correctly. A probe card may be provided within ATE 16 to connect test points on the DUT to corresponding test points of instruments within ATE 16. Also, FIG. 1 illustrates a single signal path between ATE 16 and DUT 30. One of skill in the art will appreciate that testing a DUT such as devices on a semiconductor wafer may require hundreds or thousands of test signals to be generated and measured. Accordingly, circuitry as described herein may be duplicated many times within ATE 16 and controlled to provide synchronized test signals for testing DUT 30. Further, though FIG. 1 illustrates a scenario in which a single DUT 30 is being tested, test system 10 may be configured to test multiple devices.

Regardless of the number of instruments or other components generating or measuring test signals and the number of devices under test, test system 10 may include signal delivery components that route the signals between the DUT 30 and the instruments within ATE 16.

Further, it should be appreciated that other components as illustrated are exemplary rather than limiting. For example, although the test computer 12 is illustrated as a personal computer (PC) in FIG. 1, it should be appreciated that any suitable computing device may be used to implement a test computer, for example, a mobile device or a computer work station. Test computer 12 may be connected to a network and capable of accessing resources over the network and/or communicate with one or more other computers connected to the network.

Figure 2:
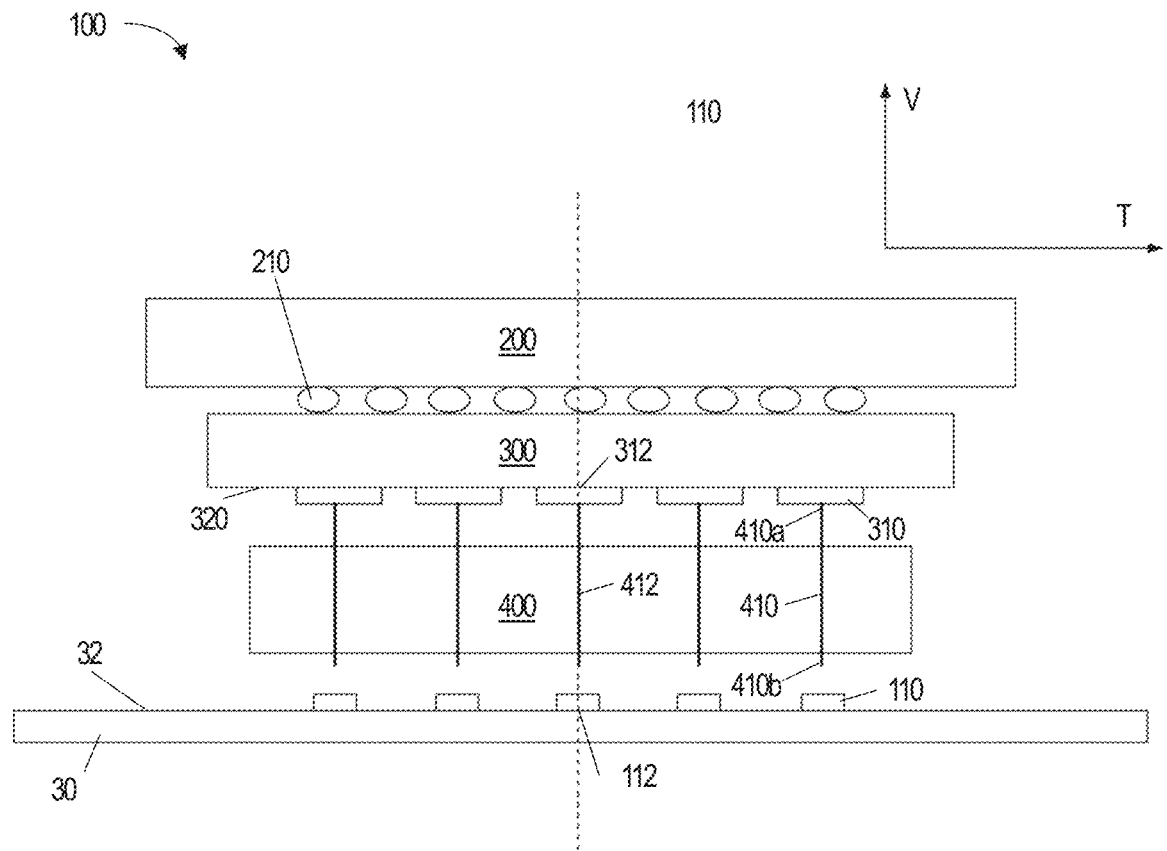
FIG. 2 is a schematic diagram of a probe card assembly, in accordance with some embodiments.

FIG. 2 is a schematic diagram of a probe card assembly 100, in accordance with some embodiments. Probe card assembly 100 may be a probe card assembly that is used in ATE 16 as shown in FIG. 1 to interface instruments within the ATE to DUT 30.

As shown in FIG. 2, probe card assembly 100 includes a first circuit board 200, a second circuit board 300, a guide plate 400 with multiple probe pins 410 disposed inside. The first circuit board 200 is stacked vertically over and electrically connected to the second circuit board 300, for example via an array of solder bumps 210, although any other suitable connections may be made between the two circuit boards. The two circuit boards 200, 300 may be part of a probe card within the probe card assembly 100. The second circuit board 300 has a plurality of pads 310 disposed on a surface 320 facing the DUT 30. Pads 310 are electrically connected to top ends 410a of probe pins 410, where each probe pin 410 has a probe needle at the free end 410b positioned to be in contact with a corresponding test point 110 on the DUT 30. Probe card 100 may be configured to test a specific DUT with a specific arrangement of test points 110, and different probe cards may be used for different DUTs. Probe card 100 may be removably attached to the rest of the ATE 10. Attachment mechanisms are known in the art and are not shown for simplicity.

DUT 30 may be one of an array of DUTs on a wafer 20 as shown in the example in FIG. 1, and one or more of the DUTs may be concurrently tested during manufacturing for quality assurance. A DUT 30 may be a semiconductor die that has an array of test points 110 exposed from an insulative surface 32 that are connected with interconnects and semiconductor components disposed within DUT 30 (not shown) below the insulative surface. Each test point 110 may be implemented as a metal pad, a portion of a metal trace, a solder bump, or any suitable conductive structure known in the art. A DUT 30 may have a large number of test points, such as at least 500, at least 1,000, or between 500 and 10,000 test points arranged on the insulative surface 32 in any suitable type of grid array. Alternatively, a DUT may have a small number of test points, in which case connections may be made to multiple DUTs on the same wafer for simultaneous testing of multiple DUTs. In either case, there may be an array of test pads to which connections are made. For simplicity of discussion, a single DUT will multiple test points will be used as an example, but it should be appreciated that other configurations are possible. Examples of grid arrays include a concentric array, a hexagonal close packed array, an orthogonal array, or a mixture thereof. Each test point may also have any suitable shape, such as but not limited to rectangular, circular, oval. The test point array has a centroid 112 that corresponds to a geometrical center of the array of test points 110 when viewed from a vertical direction (V) normal to the insulative surface 32.

Probe pins 410 may be of a vertical-type probe pin design, where each probe pin is oriented in use substantially vertically with the wafer to be probed. Each probe pin 410 may be formed from metal wire or plated micro-electromechanical systems (MEMS) having any suitable cross-sectional shape. While FIG. 2 illustrates that the probe pin is straight, it should be appreciated that each probe pin 410 may have a slight curvature in at least a section of the probe pin that forms a compliant spring when the probe pin is compressed between the pad 310 and a test point 110 on the DUT. In some embodiments, the slightly curved probe pin may be referred to as a Cobra pin, although other probe pin configurations known in the field may be suitable.

Guide plate 400 has a plurality of guide holes in which individual probe pins 410 are fitted. The guide holes are arranged in an array that aligns with the specific test points array 110 on the DUT, such that when a center of the probe pin array 412 is vertically aligned with the center 112 of the test point array, the probe needles 410b of probe pins 410 can land on and make electrical contact with each corresponding test points 110 during testing. It should be appreciated that guide plate 400 is depicted in FIG. 2 as a unitary member for the simplicity of illustration only, and aspects of the present application may also apply to a guide plate that comprises multiple components. For example, the guide plate 400 may comprise two or more plates stacked along the vertical direction, each plate in parallel to the surface 32 of DUT 30.

The second circuit board 300 may comprise a dielectric body, with an array of pads 310 disposed on a surface 320 of the dielectric body that is facing the DUT. Second circuit board 300 may be a printed circuit board (PCB) or a printed wire board. In some embodiments, second circuit board 300 may be formed of multiple layers of organic materials, such as a polymer, and may be referred to as a multi-layer organic board (MLO).

Pads 310 are formed of one or more layers of conductive material such as metal, and are arranged in an array that generally aligns to the array of probe pins 410 and the test points 110, such that each top end 410a contacts a corresponding pad 310, when a center of the pads 312 is aligned with the center 412 of the probe pin array. The center 312 of the pad array 310 may be computed as a centroid 312 of the pads in the array. In embodiments in which the array of pads is not uniform, the center may be computed as a midpoint of the distribution of the pads in each of two orthogonal directions, one of which may align with columns of pads. Each pad 310 may be of a shape and spatial arrangement that are discussed in more detail with respect to FIGS. 4-7 below.

During manufacturing of probe card 100, guide plates 400 may be mechanically fastened to the second circuit board 300 via one or more mechanical fasteners (not shown) such that the array of pads 310 and array of probe pins 410 are in contact. While the spacing and arrangement of pads 310 and probe pins 410 may be made identical, in practice tolerance during manufacturing of the components may result in location errors between a center of each pad and a top end of a probe pin that contacts the pad. As a result, the probe pins may contact corresponding pads in different locations relative to the center of the corresponding pads.

Figure 3A:
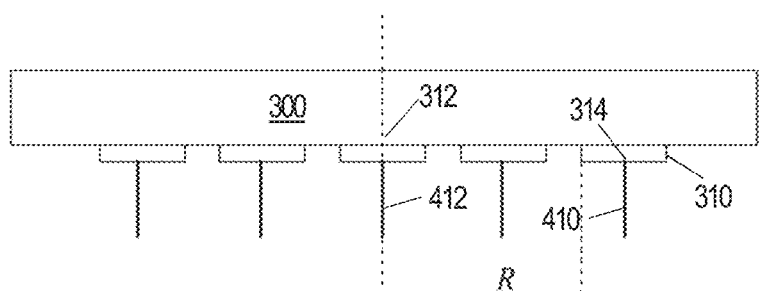
FIG. 3a and FIG. 3b are schematic diagrams illustrating pad location errors in an exemplary probe card introduced by manufacturing tolerance, according to an aspect of the present application.
Figure 3B:
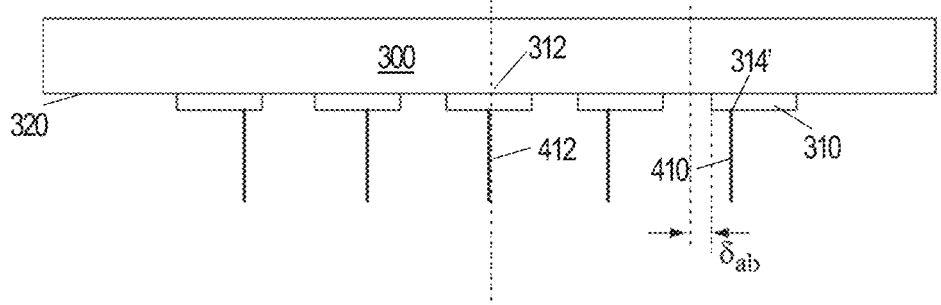

FIG. 3a and FIG. 3b are schematic diagrams illustrating pad location errors in an exemplary probe card introduced by manufacturing tolerance. FIG. 3a illustrates an exemplary second circuit board 300 without pad location errors due to manufacturing tolerance. In the example shown in FIG. 3a, when the centroid 312 of pad array 310 is aligned with center 412 of probe pins 410, each probe pin 410 contacts a corresponding pad at a contact point 314 at approximately the center of the pad. FIG. 3b illustrate a second circuit board 300 with pad location errors introduced during manufacturing. In FIG. 3b, the second circuit board has a biaxial expansion along the X-Y plane parallel to the surface 320 and as a result, pad locations for 310 are shifted outwardly by an amount $\delta_{ab}$ from the centroid 312 of the pad array along a direction R that points away from the centroid 312. Correspondingly, the contact point 314' where a probe pin 410 contacts pad 310 is shifted away from its pad center, and closer to the pad boundary by dab. Manufacturing error may occur, for example when making an MLO 300 where the pads 310 shift relative to their design locations 314. This shift can be a stretch or a compression or both (e.g., a stretch in X-direction with a compression in Y-direction). Similarly, there may be a shift when the MLO 300 is soldered via solder 210 to the PCB 200 due to thermal expansion during the melting of the solder 210. Each of these two types of manufacturing errors may manifest as the $\delta_{ab}$ error.

It should be appreciated from FIG. 3b that when $\delta_{ab}$ becomes larger than approximately half the width of a pad 310, the pad location for probe pin 410 will fall partially or completely outside the conductive surface of the pad, and thus the probe pin will fail to make reliable electrical contact with the corresponding pad. Notably, $\delta_{ab}$ may be different between pads, and for a particular pad 310, increases with a distance of a pad from the centroid 312 of the pad array. For some construction techniques, the increase may scale generally proportionally with distance from centroid 312. While FIG. 3b illustrates an example where second circuit board 300 has an expansion compared to the second circuit board 300 without manufacturing error in FIG. 3a, it should be appreciated that aspects of the present application may also apply to contractions of the circuit boards during manufacturing, and that $\delta_{ab}$ may represent an absolute amount of pad location shift, either away from or towards the center of the pad array. It should also be appreciated that guide plate 400 and probe pins 410 may similarly experience manufacturing errors to a degree, and that $\delta_{ab}$ may represent the relative pad location errors for each pad based on manufacturing errors of multiple components.

While errors introduced by manufacturing are relatively static after the probe card is manufactured, other factors such as temperature variations during operation of the probe card may additionally introduce relative movement between the pads and the probe pins. Because mechanical stress will develop at the interface of two materials of different CTEs when temperature is changed, it is desirable to reduce or eliminate CTE differences in semiconductor packaging to avoid cracking. When testing a wafer with a probe card, often times the guide plate holding the probe pins is made of material having a CTE that is close to the CTE of the wafer, which is lower compared to that of a dielectric circuit board material, which the second circuit board is formed of. For example, the guide plate may be formed of a ceramic or ceramic composite material with CTE that is close to that of the silicon wafer. As used herein, CTE refers to linear expansion coefficients in the X-Y plane that is parallel to the surface of the wafer and the surface of the second circuit board. The CTE may depend on the materials and their proportions used in manufacturing the components. In some embodiments, for example, the guide plates may have a CTE of less than 10 ppm/K, less than 5 ppm/K, or between 2 and 5 ppm/K, while the second circuit board may have a CTE of more than 15 ppm/K, more than 20 ppm/K, more than 30 ppm/K, such as between 15 and 20 ppm/K. Regardless of the specific materials used to make the guide plate and the second printed circuit board, the difference in CTE may be 10 or more ppm/K, which means that the dimensions of the second printed circuit board will change to a greater extent that the guide plate as temperature changes. As a result, the relative position of the pads and pins will change as temperature changes, which can exacerbate probe location errors.

When the DUT is being tested, the temperature of wafer 20 and DUT 30 may be controlled to vary by the prober 22 on which the wafer 20 is mounted. In some embodiments, the prober 22 pushes the wafer 20 up to press against the probe needles 410. The prober 22 may comprise heating, cooling and temperature sensing elements that are configured to set the wafer temperature to be at a particular temperature at which DUT 30 is to be tested. The wafer temperature for testing may be between 25° C. and 90° C., between −60° C. and 150° C., or between −40° C. and 125° C., for example. Sometimes, temperature conditions for testing DUT 30 involve varying the temperature to test behavior at the extreme high and low temperature ranges of the expected use cases for DUT 30 or to increase stress on the DUT to find marginal failures. The inventors have recognized that the temperature on the second circuit board 300 may be different temperature from the wafer temperature and different from temperatures in other portions of the tester. For example, the tester 16 may have a temperature of around 25° C. or close to an ambient temperature, the wafer may be at between −40° C. and 125° C., the second circuit board may be at a temperature between the wafer and tester temperatures. Similarly, the second circuit board 300 may be at a different temperature than guide plate 400. Therefore, as the probe card assembly is pressed by the wafer prober to be in contact with test points on the DUT, the probe card might not share the same cold or hot temperatures as the wafer and the test system environment. As the temperature conditions change during a test, different temperatures between components as well as different CTE of the materials used to make those components can change the relative positions of points on those components. For example, the locations of pads 310 on second circuit board 300 relative to the locations of probe pins on the guide plate 400 may change. As a result, there may be elative shifts in contact point locations of each probe pin on its corresponding pad when the second circuit board temperature goes from a first temperature $T_1$ to a second temperature $T_2$.

Figure 4A:
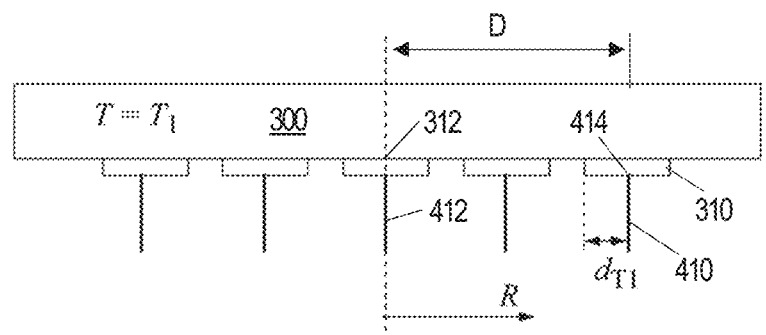
FIG. 4a and FIG. 4b are schematic diagrams illustrating pad location errors introduced by temperature changes in an exemplary probe card, according to an aspect of the present application.
Figure 4B:
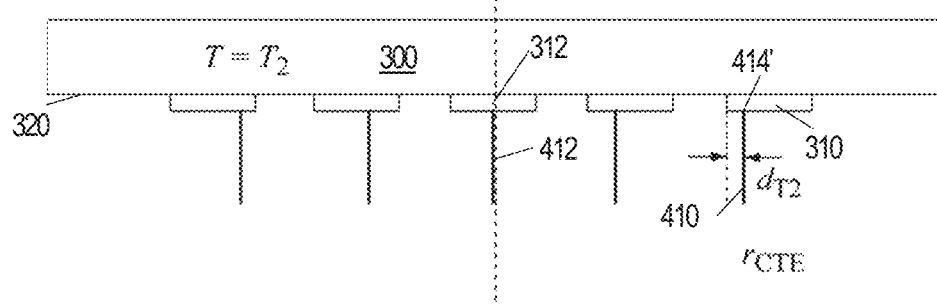
Figure 4C:
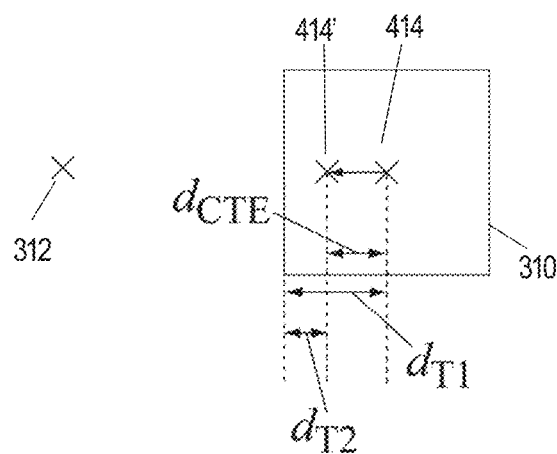
FIG. 4c is a top view diagram illustrating pad location error from temperature change, according to an aspect of the present application.

FIG. 4a, FIG. 4b and FIG. 4c are schematic diagrams illustrating pad location errors in an exemplary probe card introduced by temperature changes. FIG. 4a illustrates an exemplary second circuit board 300 at temperature $T_1$, where for the pad 310 illustrated on the right, the probe pin 410 contacts the pad at a contact point 414 that is $d_{T1}$ from the left boundary of the pad 310.

FIG. 4b illustrate the second circuit board 300 of FIG. 4a at temperature $T_2$, where the pads 310 under the second circuit board have shifted in location relative to the probe pins 410 due to the mismatched CTE between second circuit board 300 and guide plate 400 (not shown in FIG. 4b for simplicity), which is supporting probe pins 410. In the example shown in FIG. 4b, the contact point 414' at $T_2$ shifts along the direction R pointing away from the centroid 312 of the pad array to have a distance $d_{T2}$ from the left boundary of the pad 310.

FIG. 4c is a top view diagram illustrating the pad location error from temperature change. FIG. 4c shows that contact point 414 is shifted along direction R by an amount of $d_{CTE}$. $d_{CTE}$ may be different at different pads, and scales generally proportionally with a distance D between a center of a pad and the center 312 of the pad array. For example, $d_{CTE}$ may equal to $D \cdot |(CTE_1 - CTE_2) \cdot (T_1 - T_2)|$, where $CTE_1$ and $CTE_2$ are the CTE for the second circuit board and the guide plate, respectively.

Aspects of the present application are directed to providing pads that are shaped and positioned to account for the CTE-mismatch related pad location errors. In some embodiments, the pads may be elongated towards the center of the pad array. The inventors have appreciated and recognized that by making the pads longer, shifts of probe pin to pad contact points as a result of CTE differences between second circuit board 300 and guide plate 400 may be better accommodated such that there is a reduced likelihood that a probe pin fails to make contact with the conductive surface of a pad.

Figure 5:
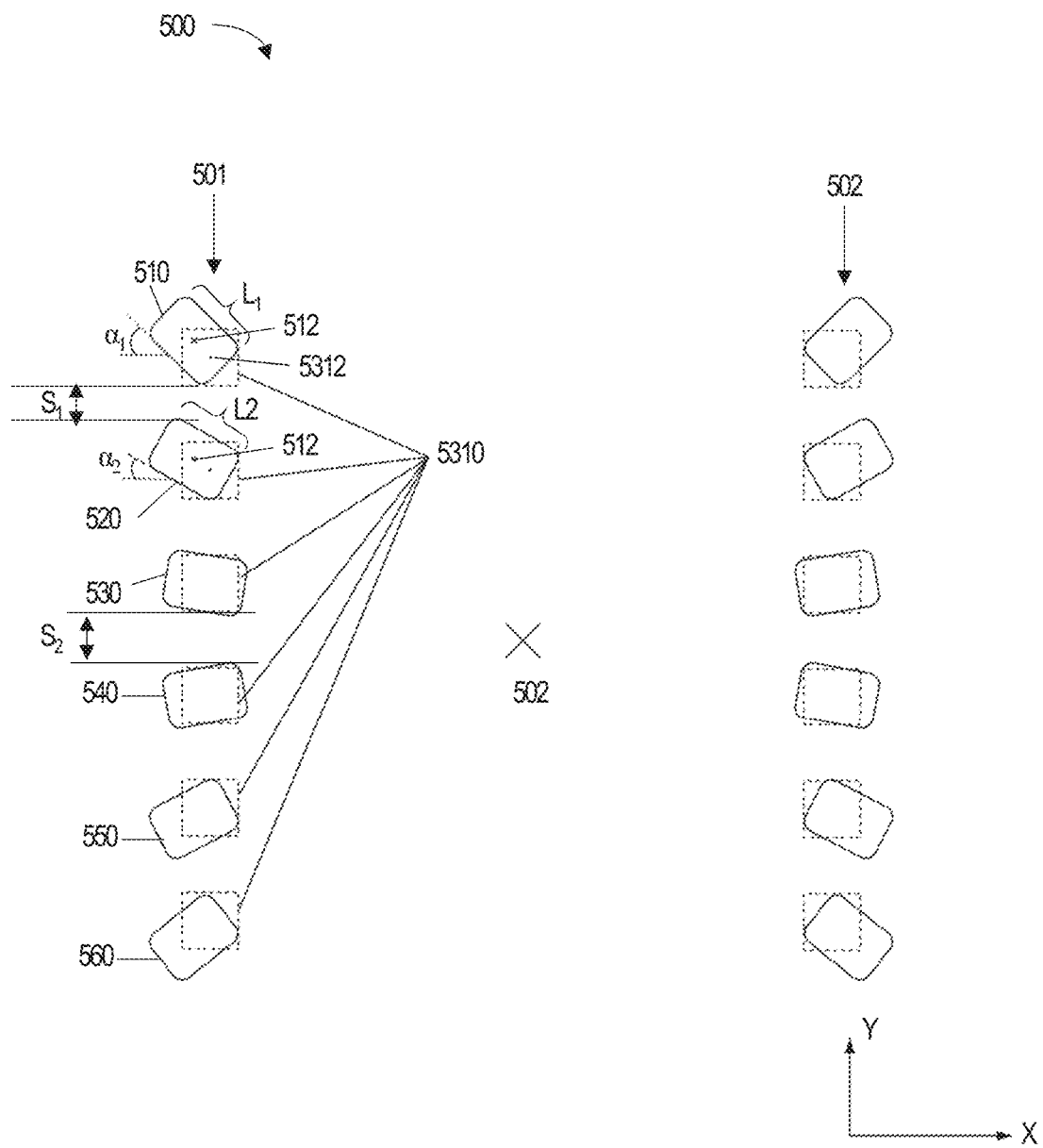
FIG. 5 is a schematic top view diagram of an exemplary pad array design for use on a surface of a circuit board in a probe card, according to some embodiments.

FIG. 5 is a schematic top view of an exemplary pad array design for use on a surface of a circuit board in a probe card, according to some embodiments. FIG. 5 shows two columns 501, 502 of a pad array 500 located side-by-side along the X direction. The array have more than two columns 501, 502, but only two are shown for simplicity of illustration. Each column comprises a plurality of elongated pads arranged along the Y direction. In the first column 501, six elongated pads 510, 520, 530, 540, 550, 560 are shown, where each elongated pad has one or more spatial parameters that is offset from a corresponding pad in a uniform pad array design 5310.

For example and as illustrated in FIG. 5, uniform pad array 5310 may comprise periodic columns of square pads of the same size and orientation along the X-Y axis, and has a constant center-to-center spacing between pads. Compared to the uniform pad array, elongated pad 510 has a pad center 512 that is shifted from the center 5312 in the corresponding pad of the uniform pad array. Furthermore, elongated pad 510 is elongated with a long axis that has a tilt angle of $\alpha_1$ relative to the X-axis, such that the elongated pad 510 is elongated in a direction that points towards a center 502 of the pad array. Elongated pad 510 has an edge with a length $L_1$ along the long axis. In the illustrated embodiment, the edge is linear. In some embodiments, a width of the shorter edge of elongated pad 510 is smaller than 70 μm, while $L_1$ is larger than 70 μm, while other suitable width and length combinations may also be used.

Each elongated pad in the pad array 500 may have a different spatial parameter offset, such as tilt angle, pad location shift, width and/or length of the pads. Thus pad array 500 is a non-uniform array. For example, elongated pad 520 is elongated with a long axis that has a tilt angle of $\alpha_2$ relative to the X-axis, such that the elongated pad 520 is elongated in a direction that points towards centroid 512 of the pad array. Elongated pad 520 has an edge with a length $L_2$ along the long axis that may be different from $L_1$ of elongated pad 510 in the same column. However, one or more of the special parameters may be different for other pads in the array. As shown in FIG. 5, tilt angles for elongated pads 510, 520, 530, 540, 550, and 560 vary monotonically as the pads are shaped to point toward the same centroid 502, such that each of pads 510, 520 . . . 560 has a different tilt angle.

Spacing between adjacent elongated pads in the pad array 500 is also non-uniform. For example, a nearest spacing $S_1$ between pad 510 and pad 520 in a center portion close to the centroid 502 as shown in FIG. 5 may be less than 20 μm, while a nearest spacing $S_1$ between pad 510 and pad 520 in an outer portion farther away from the centroid 502 may be larger than 70 μm, while other suitable spacing may also be used. It should be appreciated that the nearest spacing does not necessarily always grows larger the farther away from the centroid. For example, in some embodiments the pad sizes get bigger the further away from the centroid, and the nearest spacing may reduce due to the pad size increase. Another factor to be taken into consideration is with the direction of the expected temperature change. If the average temperature for circuit board 300 is above the average temperature of the probe needles 410, then the centers of the elongated pads may be designed to shift towards the centroid, and the gaps may be smaller the farther away from the centroid.

It should be appreciated that while two columns of elongated pads are shown in FIG. 5, the figure is for illustrative purpose only and a pad array may have any number of columns of elongated pads, and typically much larger than two. It should also be appreciated that any number of rows of elongated pads can be provided within each column. While FIG. 5 shows the elongated pads in column 501, 502 as arranged in an orthogonal array with columns and rows along the X- and Y-directions, such arrangement is not necessary as other array arrangements such as but not limited to concentric or hexagonal array can also be used.

While a rectangle with rounded corners is used in the illustration for elongated pad 510 in FIG. 5, it should be appreciated that the shape of an elongated pad is not so limited. Examples of other shapes of elongated pads include a polygon, a circle, an oval, or a racetrack as will be discussed below in relation with FIGS. 6 and 7.

Figure 6A:
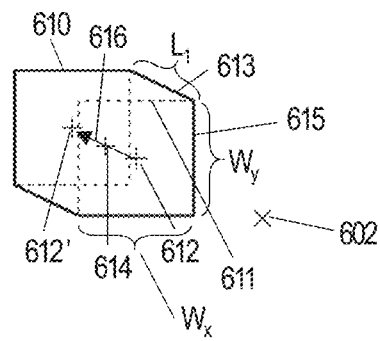
FIGS. 6A-6C are schematic diagrams illustrating examples of polygon shaped elongated pads that may be used in a probe card, in accordance with some embodiments.
Figure 6B:
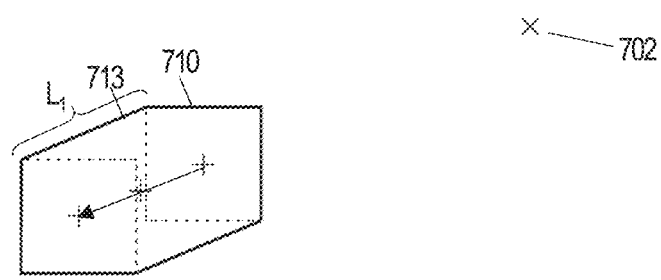
Figure 6C:
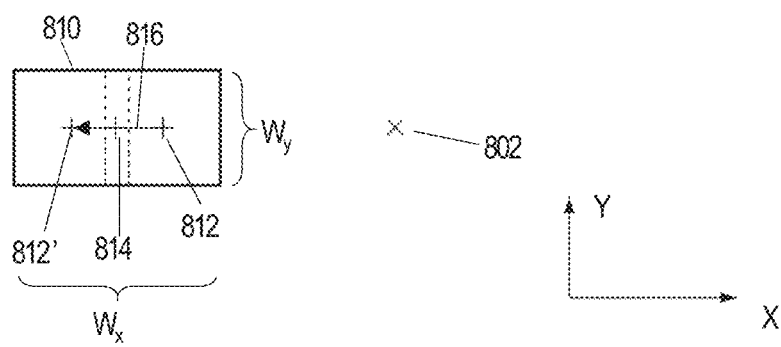

FIGS. 6A-6C are schematic top view diagrams illustrating examples of polygon shaped elongated pads that may be used in a probe card, in accordance with some embodiments. In FIG. 6A, the enclosed heavy line with reference number 610 represents a boundary of the exemplary pad 610, and shows that the elongated pad 610 has a polygon shape, relative to a center location 602 of an array of elongated pads 610. The shape and location of elongated pad 610 are designed to provide mitigation for both manufacturing error based and CTE-mismatch based pad location shifts.

In FIG. 6A, the shape of elongated pad 610 is based on an extrusion of a square shape 611 along a path 616. Path 616 begins with a contact point 612, for where a corresponding probe pin is contacting the pad at a first temperature $T_1$. When the temperature of the probe card assembly is changed such that the probe card reaches a second temperature $T_2$, the contact point of the probe pin on the pad shifts to 612'. Therefore the path 616 represents the probe pin travel across the surface of the pad 610, and is along a direction pointing away from the centroid 602 of the entire pad array. The inventors have appreciated and recognized that shaping the pad 610 to maintain at least a minimum spacing from edges of the pad to contact points of the probe pin throughout the travel path 616 can minimize risks of probe pin contact falling outside the pad. In the embodiment shown, the spacing is created by first drawing a square 611 centered at first location 612 corresponding to the first temperature $T_1$, and shifting the square along path 614 until it is centered at second location 612' corresponding to the second temperature $T_2$. Accordingly, the entire elongated pad 610 has a center at a location 614 that is at the mid-point between 612 and 612', which results in a minimum spacing between a probe pin contact point from pad edges of about half the width of the square 611. In one embodiment, $T_1$ is a hot temperature that is higher than $T_2$, which is a cold temperature.

The extrusion in elongated pad 610 has two edges 613 each parallel to the path 616, with their length equal to the path 616, or $d_{CTE}=D \cdot |(CTE_1-CTE_2) \cdot (T_1-T_2)|$ as discussed above in relation with FIG. 4c, where $d_{CTE}$ is the magnitude of the pad location shift due to relative thermal expansion. The edges define the long axis and tilt angle of the elongated pad. In some embodiments, because the center of the pad is shifted, the distance D between the pad 610 to the centroid 602 may be the distance from centroid 602 to the farthest of the two contact points at either $T_1$ or $T_2$. In the example shown in FIG. 6A, D will be the distance between 602 and contact point 612', although any other suitable method to represent D may also be used.

According to an aspect, the width $W_y$ of the elongated pad 610 is also designed to tolerate probe pin to pad location shift due to manufacturing errors. In some embodiments, $W_y$ may be set as Max (Min_pad, $\delta_{ab\_}+\delta_{other\_y}$), where Min_pad is a smallest pad size that is manufacturable in the manufacturing process for the probe card using processing techniques known in the art. $\delta_{ab\_y}$ is the y-axis component of the amount of pad location error $\delta_{ab}$ due to manufacturing of the circuit board as discussed above in relation with FIG. 3a and may be determined with a calibration procedure where actual dimensions and locations of as-manufactured probe cards are characterized at a standardized environmental condition, and compared with design values. Pad location error $\delta_{ab}$ is dependent on the distance D between the pad 610 to the center 602. $\delta_{other\_y}$ is the y-axis component of other pad location shift errors that are not dependent on the distance D. For example, $\delta_{other}$ may account for pad size tolerance during fabrication of the pads themselves, scrub length, housing alignment, etc. Similar to $\delta_{ab}$, $\delta_{other}$ may be determined with a factory calibration procedure.

It should be appreciated that 611 needs not be a perfect square, and may be a rectangle having a width $W_x$=Max (Min_pac, $\delta_{ab\_}x+\delta_{other\_}x$).

FIG. 6B shows another exemplary elongated pad 710 that is similar to elongated pad 610, but may differ in regards to one or more spatial parameters. Elongated pad 710 may be situated in an outer portion of a pad array, and has a longer distance D from the center 702 compared to elongated pad 610 as shown in FIG. 6A, which may be situated in a center portion of the pad array. As a result of the farther distance D, the length $L_2$ of elongated pad 710 is proportionally longer.

FIG. 6C shows another exemplary elongated pad 810 that is similar to elongated pad 610 in many aspects. The hot location 812 is along the x-axis from the center 802. As a result, the path 816 of the relative probe pin movement is horizontally extending from the x-direction, and the extrusion is horizontal. Thus the overall shape of elongated pad 810 is a rectangle having $W_y$=Max(Min_pad, $\delta_{ab\_}y+\delta_{other\_}y$), and $W_x$=Max(Min_pad, $\delta_{ab\_}x+\delta_{other\_}x$)+$d_{CTE}$.

Figure 7:
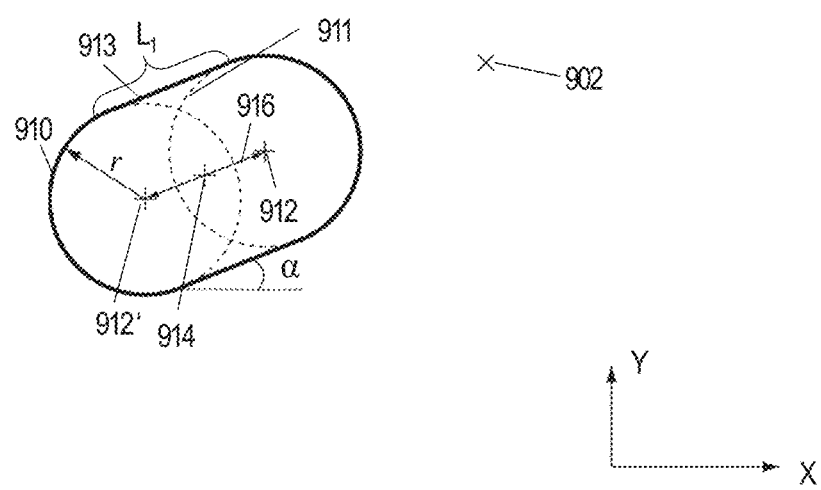
FIG. 7 is a schematic illustrating an exemplary elongated pad of a racetrack shape that may be used in a probe card, in accordance with some embodiments.

FIG. 7 is a schematic top view diagram illustrating an exemplary elongated pad of a racetrack shape that may be used in a probe card, in accordance with some embodiments. In FIG. 7, the heavy line with reference number 910 represents a boundary of the exemplary pad 910. The shape of elongated pad 910 is based on an extrusion of a circle 911 having a radius r along a path 916 from a hot contact point 912 at a hot temperature $T_1$, to a cold contact point 912' at temperature $T_2$. The path 916 represents the probe pin travel across the surface of the pad 910, and is along a direction pointing away from the center 902 of the entire pad array. Therefore the extruded racetrack shape, or oblong shape of pad 910 provides a minimum spacing of radius r between a probe pin contact point from the edges of pad 910.

The extrusion in elongated pad 910 has two linear edges 913 each parallel to the path 916, with their length equal to the path 616, or $d_{CTE}=D \cdot |(CTE_1-CTE_2) \cdot (T_1-T_2)|$ as discussed above in relation with FIG. 4c, where dcm is the magnitude of the pad location shift to account for relative thermal expansion. The linear edges define the long axis and tilt angle of the elongated pad 910.

Radius r may be designed to accommodate manufacturing errors. In some embodiments, r=Max(Min_pad, $\delta_{ab}/2+\delta_{other}/2$).

Figure 8:
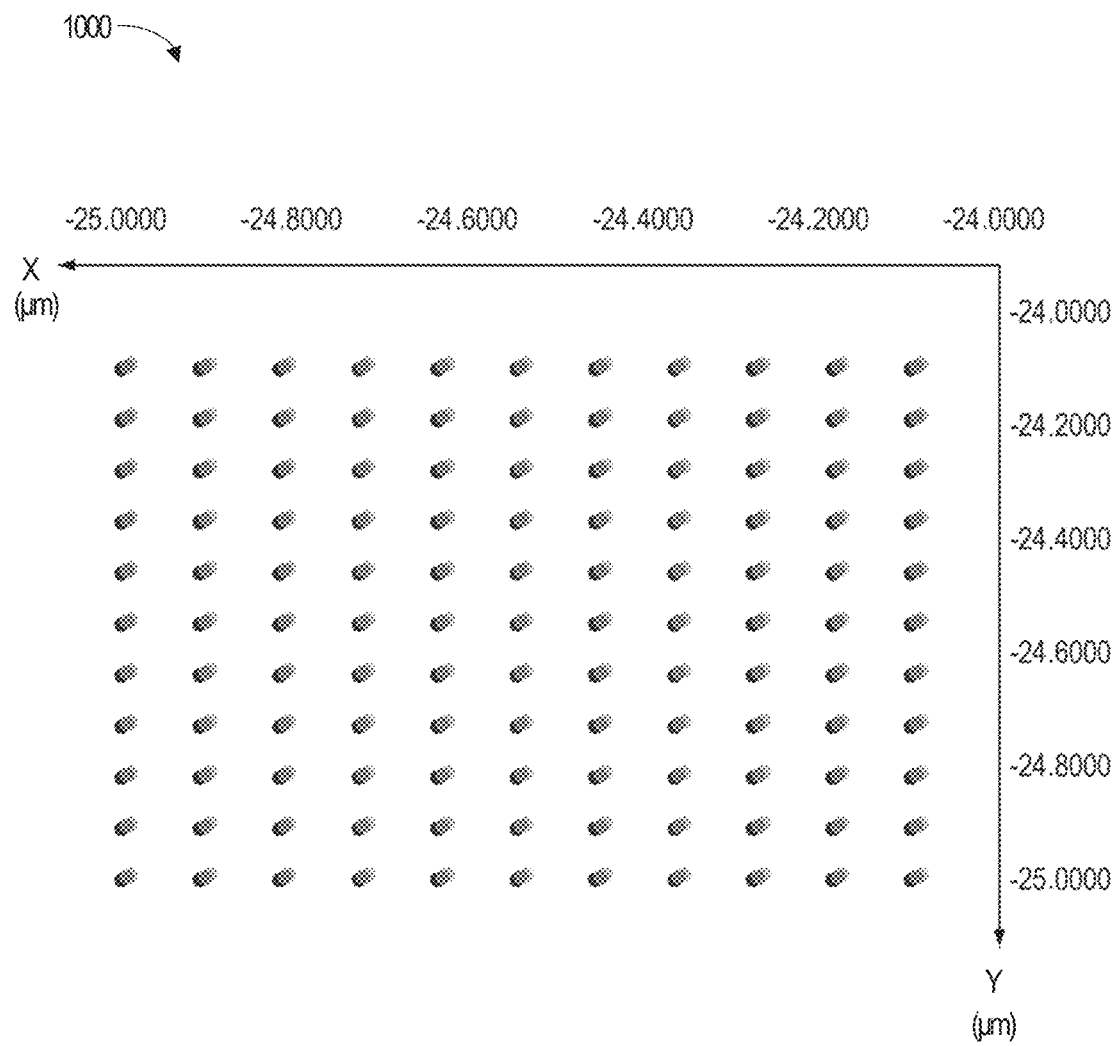
FIG. 8 is a schematic diagram illustrating a portion of a pad array on a probe card, in accordance with some embodiments.

FIG. 8 is a schematic diagram illustrating a portion of a pad array 1000 on a probe card, in accordance with some embodiments. Shown in FIG. 8 is a 11 row by 11 column partial pad array of a full array arranged along the X- and Y-axis, with a center of the full pad array located at the origin (0,0). Each pad in the array 1000 is an elongated pad designed according to aspects disclosed in the present application, and has individually designed pad shape and pad center location. In the example shown, each pad has a racetrack shape that is similar in many aspects to pad 910 as shown in FIG. 9.

Having thus described several aspects of at least one embodiment of this invention, it is to be appreciated that various alterations, modifications, and improvements will readily occur to those skilled in the art.

For example, while two major shapes (polygon and racetrack) of elongated pad shapes are disclosed as examples, it should be appreciated that aspects of the present application are not so limited in terms of pad shape. A probe card may be manufactured with pads of other shapes. Within a probe card, the pads may have different shapes within one pad array in a probe card. For example, different pad shapes may sere different functions. As a specific example, the power/ground pads may have a larger size and area compared to signal pads. In some embodiments, large power/ground pads may have a rectangular or polygon shape and may be larger than the signal pads, which may have oval or oblong shapes.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An automated test equipment for testing a device under test (DUT), comprising:
    a plurality of probe pins configured to contact the DUT;
    a probe card;
    a plurality of pads disposed on a surface of the probe card and configured to be in contact with the plurality of probe pins, the plurality of pads comprising a first column of elongated pads arranged along a first direction, each elongated pad having a long axis with a tilt angle relative to the first direction, wherein:
        a first tilt angle of a first elongated pad in the first column is different from a second tilt angle of a second elongated pad in the first column,
        the plurality of pads are arranged in an array having a center,
        the long axis of each of the elongated pads tilts toward the center of the array,
        each of the elongated pads is shaped to have a linear edge with a first length along the long axis for the respective elongated pad, such that the first lengths are proportional to distances of respective elongated pads from the center of the array, and wherein
        the probe card comprises a circuit board having a first coefficient of thermal expansion (CTE), and the plurality of pads are disposed on a surface of the circuit board, and the plurality of probe pins are disposed in a guide plate having a second coefficient of thermal expansion (CTE), wherein the elongated pads are shaped such that:
        the first lengths are proportional to a difference between the first and second CTEs.

2. The automated test equipment of claim 1, wherein each of the elongated pads is shaped to have a width, and wherein
the widths vary based on distances of respective elongated pads from the center of the array.

3. The automated test equipment of claim 1, wherein:
the guide plate is configured to:
    position a first probe pin of the plurality of probe pins to be in contact with a first elongated pad of the first column of elongated pads at a first location when the DUT is at a first temperature of no more than −40° C., and
    position the first probe pin to be in contact with the first elongated pad at a second location when the DUT is at a second temperature of at least 55° C., and
a center of the first elongated pad is between the first location and the second location.

4. The automated test equipment of claim 1, wherein each of the elongated pad is further shaped to have two linear edges having the first length and in parallel with the long axis.

5. The automated test equipment of claim 1, wherein tilt angles for elongated pads in the first column vary monotonically from a center of the first column to an end of the first column.

6. The automated test equipment of claim 1, wherein a spacing between adjacent elongated pads in the first column along the first direction varies from a center of the first column to an outer portion of the first column.

7. The automated test equipment of claim 6, wherein the spacing at the center of the first column is less than 70 μm, and wherein the spacing at the outer portion of the first column is more than 70 μm.

8. The automated test equipment of claim 1, wherein the circuit board is a multilayer organic board.

9. The automated test equipment of claim 1, wherein the probe pins comprise needles that extend perpendicularly from the surface of the probe card where the plurality of pads are disposed thereon.

* * * * *